United States Patent
Andricacos et al.

(10) Patent No.: US 6,323,127 B1
(45) Date of Patent: Nov. 27, 2001

(54) CAPACITOR FORMED WITH PT ELECTRODES HAVING A 3D CUP-LIKE SHAPE WITH ROUGHENED INNER AND OUTER SURFACES

(75) Inventors: Panayotis Andricacos, Croton-on-Hudson; Gregory Costrini, Hopewell Junction, both of NY (US); David Edward Kotecki, Orono, ME (US); Katherine Lynn Saenger, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/599,698

(22) Filed: Jun. 22, 2000

(51) Int. Cl.[7] .................................................. H01L 21/4763
(52) U.S. Cl. ...................... 438/650; 438/396; 438/239; 438/238
(58) Field of Search ..................................... 438/650, 396, 438/239, 238, 240

(56) References Cited

U.S. PATENT DOCUMENTS

| | | | |
|---|---|---|---|
| 5,342,806 | * 8/1994 | Asahina | 437/195 |
| 5,561,082 | * 10/1996 | Matsuo et al. | 437/187 |
| 5,565,707 | * 10/1996 | Colgan et al. | 257/762 |
| 5,633,781 | * 5/1997 | Saenger et al. | 361/321.4 |
| 5,789,320 | 8/1998 | Andricacos et al. | |
| 5,861,331 | 1/1999 | Chien | |
| 5,946,566 | 8/1999 | Choi | |

* cited by examiner

*Primary Examiner*—John F. Niebling
*Assistant Examiner*—Olivia Luk
(74) *Attorney, Agent, or Firm*—Scully, Scott, Murphy & Presser; Steven Capella, Esq.

(57) ABSTRACT

A noble metal electrode structure having a cup-like, approximately cylindrical shape, roughened inner and outer surfaces, and a surface area of at least 1 sq. micron or greater is provided as well as a capacitor which includes the noble metal electrode as a bottom electrode. The high-surface area noble metal electrode is formed by electroplating into annular channels that have roughened sidewalls formed by the oxidation of vapor-deposited Si nuclei.

20 Claims, 4 Drawing Sheets

CAPACITOR FORMED WITH PT ELECTRODES HAVING A 3D CUP-LIKE SHAPE WITH ROUGHENED INNER AND OUTER SURFACES

FIELD OF THE INVENTION

The present invention relates to a noble metal electrode and to a method of manufacturing the same. More particularly, the present invention relates to a method of fabricating a high-surface area (1 sq. micron or greater) noble metal electrode that can be employed as the bottom electrode of a capacitor.

BACKGROUND OF THE INVENTION

In the field of semiconductor memory devices such as dynamic random access memory (DRAM) and ferroelectric random access memory (FRAM), it is known to employ capacitors containing noble metals such as Pt, Pd, Ir, and Ru as one of the electrodes and high-$\epsilon$ or ferroelectric materials as the dielectric. These materials provide a high-dielectric constant capacitor suitable for use in Gigabit memory applications.

Despite their importance in providing Gigabit memory devices, noble metals and high-$\epsilon$ or ferroelectric dielectrics have some problems associated therewith. Insofar as the noble metals are concerned, Pt, along with the other noble metals are difficult to pattern by conventional techniques such as reactive-ion etching (RIE) or wet chemical etching, especially at the deep sub-micron dimensions required for high density DRAM and FRAME. Alternative patterning Techniques using electrochemical deposition processes such as through-mask plating have been described in U.S. Pat. No. 5,789,320.

Recently, it has been reported that 10 nm $Ta_2O_5$ films deposited on Pt electrodes could be produced with an oxide equivalent thickness of 0.9 nm and a leakage current density of less than 10 $nA/cm^2$ (sufficient to meet the requirements of future DRAMs), See, for example, "Structure and Electrical Properties of thin $Ta_2O_5$ Deposited on Metal Electrodes, K. Kishiro, et al., Jap. J. Appl. Phys. 1, 37, 1336 (1998). However, in order to use $Ta_2O_5$ and other high-$\epsilon$ dielectrics or ferroelectric materials successfully in future memory devices, bottom electrode structures will need to have surface area of 1 sq. micron or greater in a very much smaller footprint. Without such enhanced-area electrodes, high density devices with the desired capacitance will require :dielectrics such as $(Ba,Sr)TiO_3$ (BST) which have lower oxide equivalent thicknesses, but are more challenging to integrate than $Ta_2O_5$.

SUMMARY OF THE INVENTION

One object of the present invention is to provide a method of fabricating a 3-dimensional capacitor structure with a high capacitance and a small footprint.

Another object of the present invention is to provide a method of fabricating a noble metal electrode that has a high-surface area, on the order of 1 sq micron or greater, associated therewith.

A further object of the present invention is to provide DRAM and FRAM storage devices which include at least the noble metal electrode of the present invention as a bottom electrode of a capacitor element.

These and other objects and advantages are achieved in the present invention by providing a cup-like, approximately cylindrical noble metal electrode with roughened inner and outer surfaces to provide additional surface area.

One aspect of the present invention thus relates to a method of fabricating a noble metal electrode having a surface area of about 1 sq. micron or greater. The method of fabricating the inventive noble metal electrode comprises the steps of:

(a) forming an electrode seed layer on a surface of a substrate;

(b) forming a silicon nitride layer on said electrode seed layer;

(c) forming a layer of silicon oxide on said silicon nitride layer;

(d) providing a patterned photoresist mask over said layer of silicon oxide and etching exposed portions of said silicon oxide until portions of said silicon nitride layer are exposed, and sidewalls of silicon oxide remain above the exposed silicon nitride layer to define spaces above said exposed silicon nitride layer;

(e) forming polysilicon sidewall spacers on said sidewalls;

(f) forming additional silicon oxide in said spaces whereby said spaces are completely filled;

(g) removing said polysilicon sidewall spacers to expose portions of said silicon nitride layer and to create annular channels having silicon oxide channel sidewalls;

(h) providing silicon nuclei on said channel sidewalls and oxidizing the nuclei to create a roughened channel wall surface;

(i) removing said silicon nitride layer at said channels to expose said seed layer;

(j) forming a noble metal layer in said channel to at least partially fill the same;

(k) removing said silicon oxide, said silicon nitride layer, and said seed layer external to said annular channels; and (l) removing any remaining portions of said silicon oxide and silicon nitride interior to said annular channels to provide an electrode having a cylindrical shape and roughened inner and outer surfaces.

Further process steps can be included to the above processing steps in providing a capacitor that includes at least the inventive noble metal electrode as the bottom electrode of the capacitor structure.

Specifically, the capacitor structure is formed by first conducting steps (a)–(l) above and then the following steps are employed:

(m) forming a dielectric material layer about said electrode, said dielectric material is a high-$\epsilon$ or ferroelectric material; and (n) forming a conductive material layer on said dielectric material layer.

Another aspect of the present invention relates to a noble metal electrode structure which comprises a patterned noble metal having a cylindrical shape, roughened inner and outer surfaces, and a surface area of at least 1 sq. micron or greater.

Further aspects of the present invention relate to a capacitor and a memory device, i.e., DRAM or FRAM, which include at least the high-surface area noble metal electrode of the present invention as a bottom electrode.

DETAILED DESCRIPTION OF THE INVENTION

Figure 1:
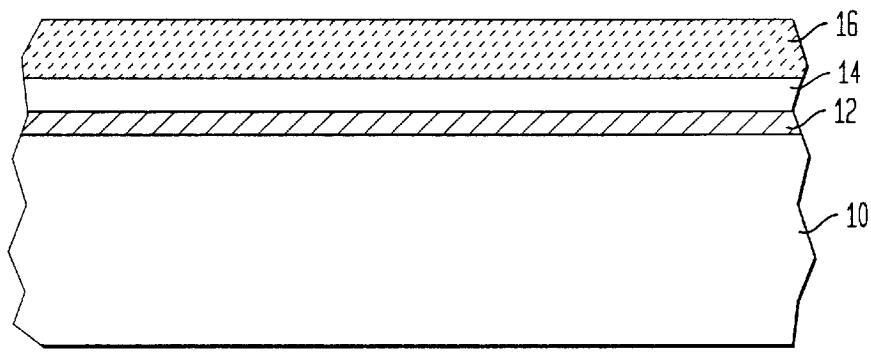
FIGS. 1–10 are cross-sectional views showing the various processing steps of the present invention that are employed in fabricating the inventive high-surface area noble metal electrode.

The present invention which is directed to a method of forming a cylindrical shaped, high-surface area noble metal electrode useful as a bottom electrode for a capacitor in DRAM and FRAM applications will now be described in more detail by referring to the drawings that accompany the present application. It should be noted that like and/or corresponding elements in the accompanying drawings are referred to by like reference numerals.

Reference is first made to FIGS. 1–10 which show the basic processing steps of the present invention which are employed in fabricating the inventive high-surface area noble metal electrode. The inventive process begins with forming the initial structure shown in FIG. 1.

Specifically, FIG. 1 is a cross-sectional view of a layered structure which comprises substrate 10, electrode seed layer 12 formed on a surface of said substrate, silicon nitride layer 14 formed on electrode seed layer 12 and silicon oxide layer 16 formed on silicon nitride layer 14.

The layered structure shown in FIG. 1 is formed utilizing conventional deposition processes well known to those skilled in the art and the layered structure is composed of materials that are also well known of those skilled in the art.

Substrate 10 typically comprises conductive, insulating and semiconducting regions in a semiconductor wafer. These regions (not shown) may be buried or interspersed with additional patterned or blanket layers which may provide functionalities including, but not limited to: adhesion and diffusion barrier functions.

The semiconductor wafer may be composed of any semi-conducting material including, but not limited to: Si, Ge, SiGe, GaP, InAs, InP and all other III/V compound semiconductors. The wafer may also be composed of a layered semiconductor such as Si/SiGe or a silicon-on-insulator (SOI) semiconductor. The wafer may be of the n or D-type depending on the desired device to be fabricated. Moreover, the wafer may contain various active and/or isolation regions either formed in or on the wafer using processing techniques well known to those skilled in the art.

Electrode seed layer 12 is formed on substrate 10 utilizing a conventional deposition process such as chemical-vapor deposition (CVD), plasma-assisted CVD, including high-density-plasma (HDP)-assisted CVD, plating, evaporation, sputtering, reactive-sputtering and other like deposition processes. The term "electrode seed layer" is used herein to denote an initial layer of conductive material, e.g., the noble metals such as Ru, Os, Dd, Pt, AG and Au or alloys thereof, or conductive oxides such as $IrO_2$ or $RuO_2$, that is used in forming she bottom portion of -he inventive high-surface area noble metal electrode. A highly preferred material for the electrode seed layer is Pt or a P-containing alloy. The thickness of the electrode seed layer is not critical to the present invention, but typically, the thickness of the electrode seed layer is from about 5 to about 100 nm, with a thickness of from about 10 to 40 nm being more preferred.

Silicon nitride layer 14 is formed on the electrode seed layer utilizing one of the above mentioned deposition processes. Other materials may be substituted for the silicon nitride layer, providing they have the necessary thermal stability, oxidation resistance, and etch characteristics. The thickness of the silicon nitride layer is not critical to the present invention, but typically, the thickness of the silicon nitride layer is from about 10 to about 100 nm.

Silicon oxide layer 16 is formed on the silicon nitride layer utilizing one of the above mentioned deposition processes. In a highly preferred embodiment of the present invention, the silicon oxide layer is a CVD TEOS (tetraethylorthosilicate) layer. The thickness of the silicon oxide layer is not critical to the present invention, but typically, the thickness of the silicon oxide layer is from about 200 to about 1200 nm.

Figure 2:
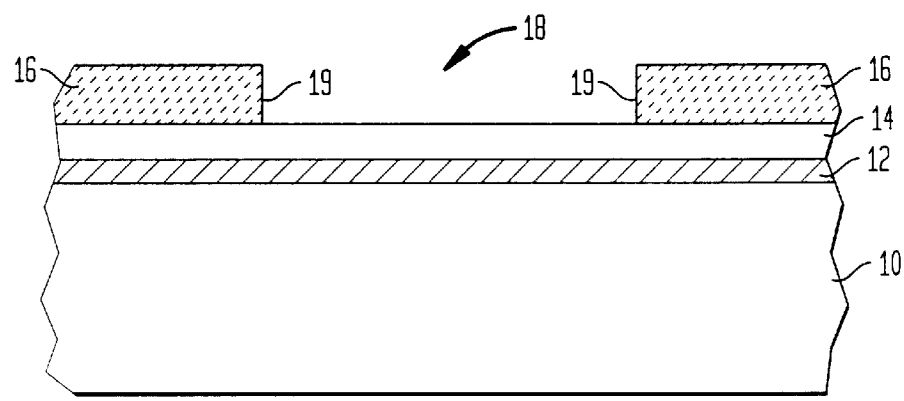

Next, as shown in FIG. 2, a portion of silicon oxide layer 16 is selectively removed from the structure of FIG. 1, stopping on the silicon nitride layer so as to provide an opening or space 18. Opening 18 is bounded by silicon nitride layer 14, and on its sides by silicon oxide sidewalls 19 formed in silicon oxide layer 16. The lateral dimensions or opening 18 define the approximate footprint of the finished electrode. A typical lateral dimension might be, for example, 200 nm.

The structure shown in FIG. 2 may be formed utilizing lithography processes known to those skilled in the art and etching. The etching step employed in defining the space includes a conventional dry etch process such as reactive-ion etching (RIE), ion-beam etching, plasma-etching and other like dry etch processes.

It is noted that although the drawings of the present invention show the formation of only one space in the structure of FIG. 1, the present invention also works well in forming a plurality of spaces in the structure. After etching the silicon oxide layer, the photoresist employed in defining the space is removed utilizing a conventional stripping process well known to those skilled in the art.

Figure 3:
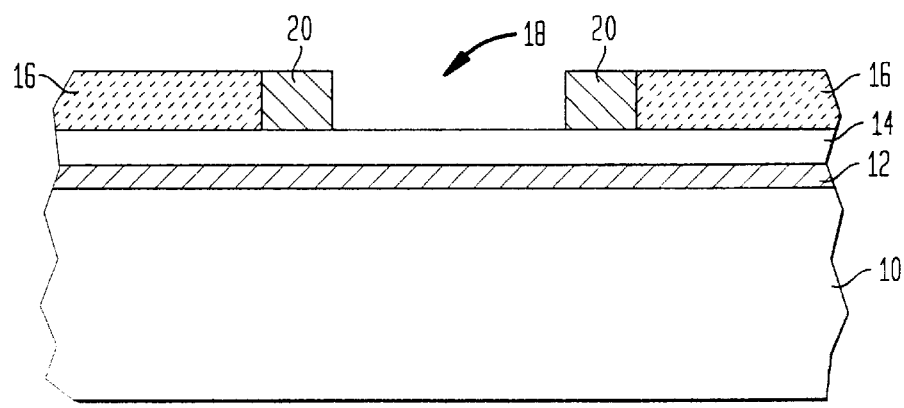
Figure 4:
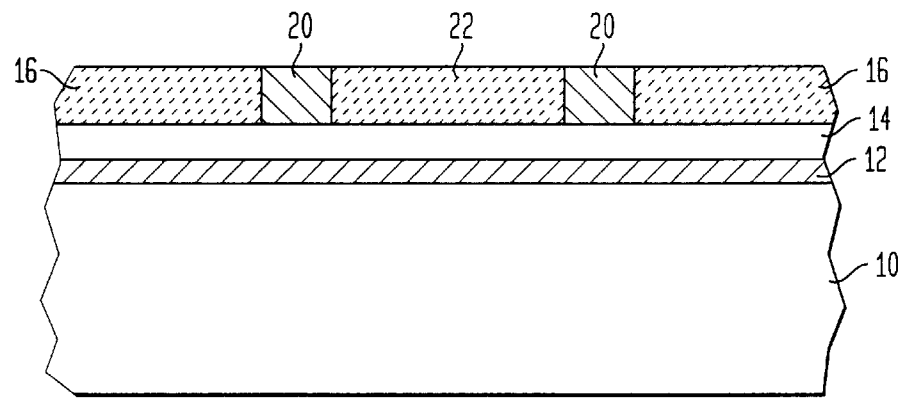

Next, as shown in FIG. 3, polysilicon sidewall spacers 20 are formed on the silicon oxide sidewalls 19, for example, by depositing a thin layer of polysilicon to $SiO_2$ layer and line opening 18 and then removing the horizontal portions of the polysilicon layer with an anisotropic etch. The polysilicon layer may be formed by CVD or any other process known in the art. Typically, in the present invention, the thickness of polysilicon sidewall spacers 20 is from about 5 to about 100 nm, with a thickness of from about 20 to about 70 nm being more preferred. It is noted that polysilicon sidewall spacers 20 serve as sacrificial spacers that are removed in a subsequent processing step of the present invention.

After formation of polysilicon sidewall spacers 20 on the sidewalls of the opening, the opening is over filled with additional silicon oxide 22 and planarized. The additional silicon oxide may be formed utilizing the same or different deposition technique as is used in forming silicon oxide layer 18.

A preferred deposition technique used in forming the additional silicon oxide in the opening is a high density plasma (HDP) CVD process. The HPD CVD process forms a silicon oxide layer that has a different etching rate as compared to the previously formed silicon oxide layer. The structure is planarized utilizing a conventional planarization process such as chemical-mechanical polishing (CMP) or grinding so as to provide the planar structure shown in FIG. 4.

Figure 5:
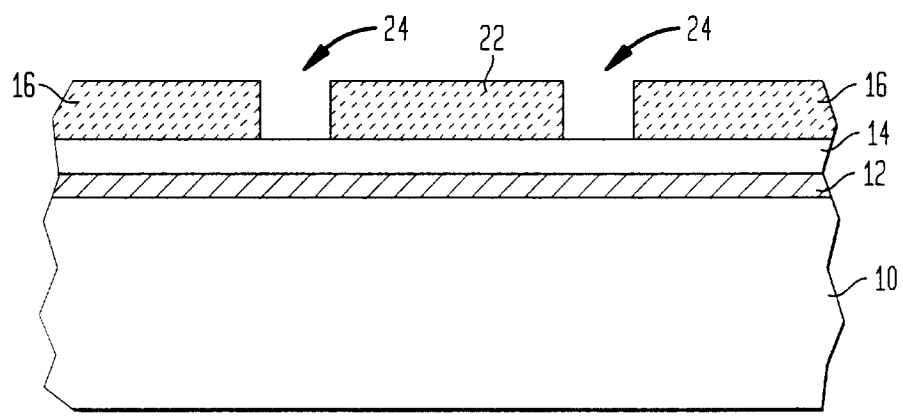

Next, as shown in FIG. 5, the sacrificial spacers, i.e., polysilicon spacers 20, are removed from the structure exposing portions of the nitride layer so as to create annular channels 24 having silicon oxide sidewalls. The sacrificial spacers are removed by utilizing a chemical etchant that is highly selective in removing polysilicon as compared to oxide or nitride. Alternatively, a dry etching process such as RIE may be used in creating the structure shown in FIG. 5.

Figure 6:
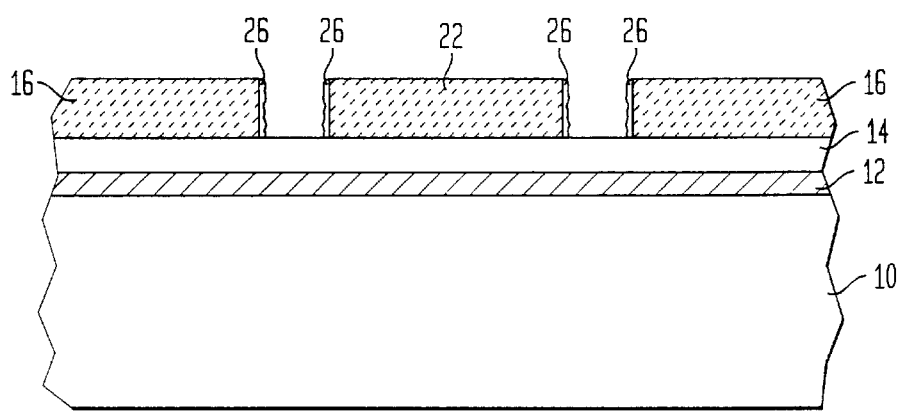

Following the formation of the annular channels in the structure, Si nuclei are formed on the sidewalls of the annular channels and, thereafter he Si nuclei are subjected to an oxidation step that is capable of forming roughened channel walls 26. The structure following deposition of the Si nuclei and oxidation is shown in FIG. 6. It is noted that these two processing steps are the key to increasing the surface area of the inventive noble metal electrode.

The Si nuclei are formed in the present invention by utilizing CVD processes known in the art, for example, conventional CVD, ultra-high vacuum CVD, plasma-assisted CVD and hemispherical grain (HSG) CVD processes.

Oxidation is performed in an oxidizing ambient containing oxygen, ozone, $N_2O$ or other like oxygen-containing ambient that is capable of oxidizing Si into a roughened silicon oxide region. The oxidization is carried out at a temperature of from about 300° to about 1100° C. and for a time period of from about 1 second to about 4 hours. Other temperatures and times are also contemplated herein. The oxidation may be carried out at a single oxidation temperature or various ramp and soak cycles may be used.

Figure 7:
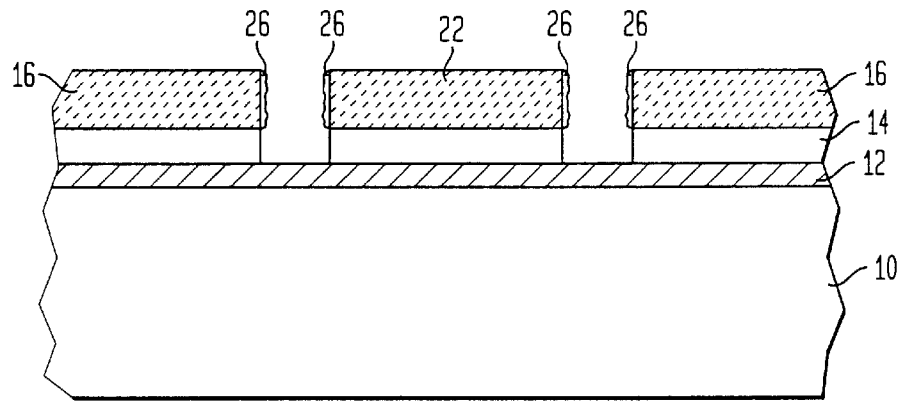

Next, as shown in FIG. 7, exposed nitride layer 14 in the annular channels is removed utilizing a conventional etching process such as RIE and, optionally, the exposed electrode seed layer is cleaned by utilizing a conventional cleaning process such as RIE with a F-based or Cl-based RIE chemistry, or sputter cleaning.

Figure 8:
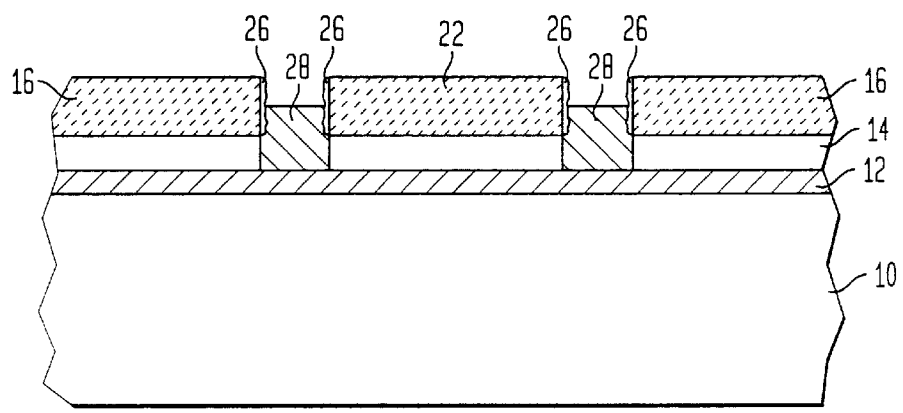

FIG. 8 illustrates the next step of the present invention wherein a noble metal (which may be the same or different from the seed layer) is formed in the annular channels so as to at least partially fill the same; in FIG. 8 reference numeral 28 refers to the noble metal layer formed in annular channels. The noble metal layer is formed in the present invention utilizing the plating process disclosed in U.S. Pat. No. 5,789,320, the contents of which are enclosed herein by reference.

It should be noted that the electrodeposits must conform to the shape of the roughened cavity walls if the roughness of the oxidized Si nuclei is to be fully replicated in the surface morphology of the final electrodes. Some additional optimization of plating conditions (current density, bath temperature, etc.) may be necessary if deposit conformality varies with cavity dimension. Additionally, it should be noted that the plating process is preferably stopped before the cavities are completely filled to avoid deposit overgrowth (which may short neighboring electrodes together and prevent complete removal of sacrificial oxide layers).

Figure 9:
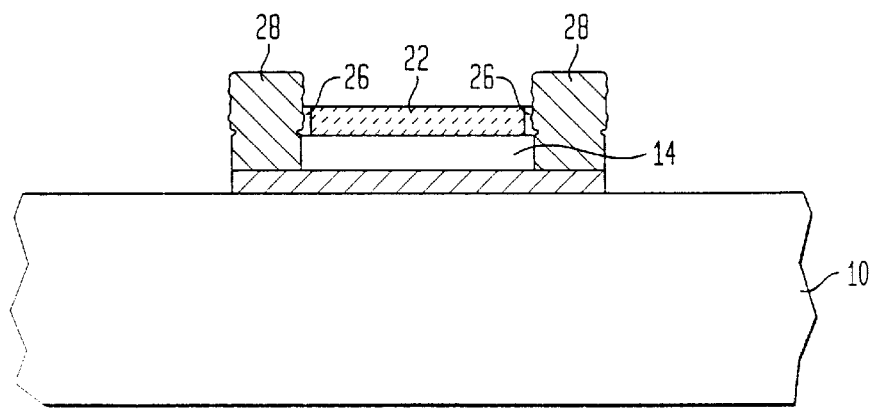

Following the partial filling of the annular channels with plated noble metal, any silicon oxide (including region 26), silicon nitride and electrode seed layer external to the partially filled annular channels are removed providing the structure shown in FIG. 9. It is noted that during this step of the present invention some of the additional silicon oxide layer 22 as well as silicon oxide region 26 formed between two neighboring annular channels formed in the same opening is removed from the structure.

The structure shown in FIG. 9 is formed utilizing two separate etching steps wherein the external silicon oxide layer and the nitride layers are removed utilizing a chemical etchant that has some selectivity to the additional silicon oxide layer 22 so as to expose the seed layer. The exposed seed layer external to the annular channels is then removed utilizing the remaining additional silicon oxide layer in said spaces as an etch mask. Specifically, the externally exposed seed layer is removed utilizing an anisotropic RIE process or ion beam etching.

Figure 10:
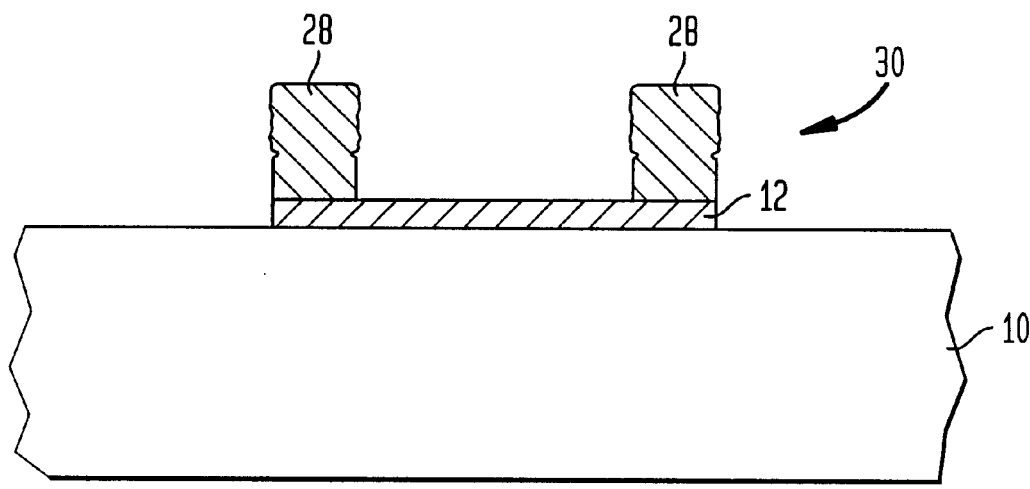

Next, as shown in FIG. 10, the inventive electrode is completed by removing remaining portions of oxide layer 22 as well as interior silicon oxide and silicon nitride layer 14 from the structure. These layers may be removed by utilizing a dry etching process such as RIE.

As stated above, FIG. 10 illustrates the inventive noble metal electrode 30 of the present invention. Specifically, the noble metal electrode shown in FIG. 10 is characterized has having a cylindrical, i.e., cup-like, 3D shape having roughened inner and outer surfaces. The roughened inner and outer surfaces provide an electrode having enhanced surface area. In particular, the electrode shown in FIG. 10 has a surface area of about 1 sq. micron or higher associated therewith.

Figure 11:
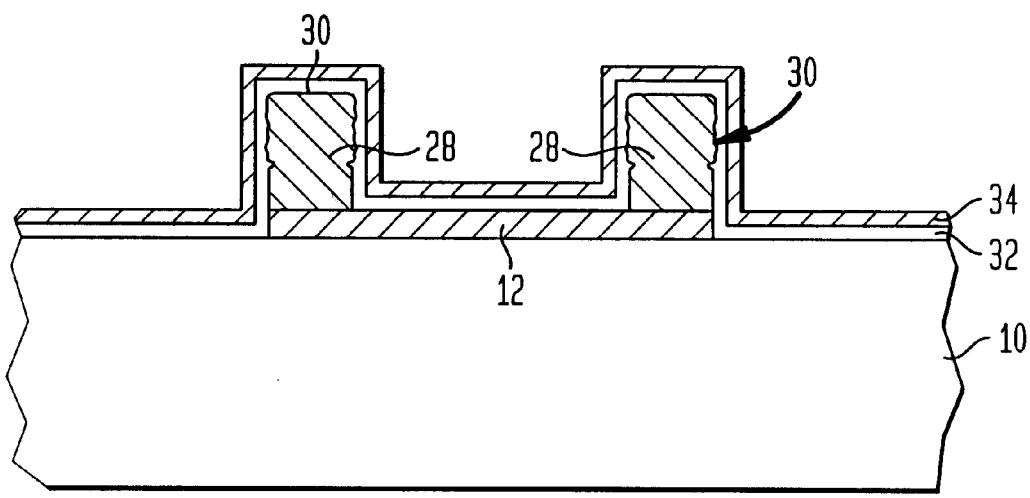
FIG. 11 is cross-sectional view showing the capacitor structure of the present invention which includes the high-surface area noble metal electrode produced in FIGS. 1–10 as the bottom electrode.

The inventive electrode shown in FIG. 10 may be used as a bottom electrode of a capacitor. The capacitor structure including the inventive electrode of the present invention is shown in FIG. 11. Specifically, the capacitor of FIG. 11 comprises a bottom electrode 30 formed as described above, a dielectric material layer 32 surrounding said bottom electrode, and an upper electrode 34 formed on said dielectric material layer.

The dielectric material employed in the present invention includes any high-c or ferroelectric material that is well known to those skilled in the art. Some illustrative examples of high-$\epsilon$ materials having epsilon of above about 10 include, but are not limited to: $(Ta_2O_5)$ $(TiO_2)_{1-x}$, $TiO_2$, $SrTiO_3$, $(Ba,Sr)TiO_3$, silicates, other metal oxides, oxynitrides, perovskites and pyrochlores.

Illustrative examples of ferroelectric materials that can be employed in the present invention include, but are not limited to: perovskite-type oxides, $PbZr_{1-x}Ti_xO_3$ (PZT), $Pb_{1-x}La_x$ $(Zr_yTi_{1-y})O_3$ (PLZT), $SrBi_2Ta_2O_9$, compounds containing a pyrochlore structure, a potassium dihydrogen phosphate, phosphates of rubidium, cesium or arsenic and mixtures and multilayers thereof.

The dielectric material layer is formed utilizing a conventional deposition process such as CVD, plasma-assisted CVD, chemical solution deposition (CSD), evaporation and other like deposition processes. After deposition of the dielectric material layer, the deposited layer may be optionally patterned utilizing a conventional patterning process.

The top electrode of the capacitor is composed of a conductive material layer such as a non-noble metal, noble metal, doped polysilicon or mixtures and combinations thereof. A preferred material for the conductive material layer is TiN. The top electrode is formed utilizing any conventional deposition process used in forming a conductive layer, and following deposition the deposited conductive material layer may be patterned. Alternatively, both the dielectric material layer and the top electrode may be patterned at the same time utilizing any well known process that is capable of patterning a dielectric layer and a conductive layer.

The capacitor structure shown in FIG. 11 may be used as one of the components of a DRAM or FRAM device. In such applications, the device would also include a field effective transistor as well as other components that make-up a memory cell.

While this invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims. In particular silicon nitride layer 12, layer 16, polysilicon sidewall spacers 20, and SiO$_2$ may be substituted, respectively, with a first, second and third disposable material having the etch selectivities and thermal stabilities required to make the inventive process work as described, wherein the first, second and fourth disposable materials are insulating materials and the third disposable material may or may not be insulating.

Having thus described our invention in detail, what we claim as new and desire to secure by the Letters Patent is:

1. A method for forming a noble metal electrode comprising the steps of:
   (a) forming an electrode seed layer on a surface of a substrate;
   (b) forming a silicon nitride layer on said electrode seed layer;
   (c) forming a layer of silicon oxide on said silicon nitride layer;
   (d) providing a patterned photoresist mask over said layer of silicon oxide and etching exposed portions of said silicon oxide until portions of said silicon nitride layer are exposed, and sidewalls of silicon oxide remain above the exposed nitride layer to define spaces above said exposed silicon nitride layer;
   (e) forming polysilicon sidewall spacers on said sidewalls;
   (f) forming additional silicon oxide in said spaces whereby said spaces are completely filled;
   (g) removing said polysilicon sidewall spacers to expose portions of said nitride layer and to create annular channels having silicon oxide channel sidewalls;
   (h) providing silicon nuclei on said channel sidewalls and oxidizing the nuclei to create a roughened channel wall surface;
   (i) removing said silicon nitride layer at said channels to expose said seed layer;
   (j) forming a noble metal layer in said channel to at least partially fill the same;
   (k) removing said silicon oxide, said silicon nitride layer, and said seed layer external to said annular channels; and
   (l) removing any remaining portions of said silicon oxide and silicon nitride interior to said annular channels to provide an electrode having a cylindrical shape and roughened inner and outer surfaces.

2. The method of claim 1 wherein said electrode seed layer is comprised of a conductive material selected from the group consisting of noble metals and conductive oxides.

3. The method of claim 2 wherein said noble metal is Pt or a Pt-containing alloy.

4. The method of claim 1 wherein said electrode seed layer is formed by a deposition process selected from he group consisting of chemical vapor deposition (CVD), plasma-assisted CVD, high-density-plasma-assisted CVD, sputtering, reactive sputtering, plating and evaporation.

5. The method of claim 1 wherein said silicon oxide layer is formed by CVD of tetraethylorthosilicate (TEOS).

6. The method of claim 1 wherein step (d) includes lithography and reactive-ion etching.

7. The method of claim 1 wherein said polysilicon sidewall spacers are formed by a directional deposition process or CVD and RIE.

8. The method of claim 1 wherein said additional silicon oxide is formed by a high density plasma chemical vapor deposition process.

9. The method of claim 1 wherein said additional silicon oxide has an etch rate that differs from said silicon oxide formed in step (c).

10. The method of claim 1 wherein RIE is used in removing said polysilicon sidewall spacers.

11. The method of claim 1 wherein said silicon nitride layer, silicon oxide layer, polysilicon sidewall spacers and additional silicon oxide are substituted, respectively, with a first, second and third disposable material having the etch selectivities and thermal stabilities required to make the inventive process work as described, wherein the first, second and fourth disposable materials are insulating materials and the third disposable material may or may not be insulating.

12. The method of claim 1 wherein said Si nuclei are formed by a deposition process selected from the group consisting of CVD, ultra-high vacuum CVD, plasma-assisted CVD and hemispherical grain CVD.

13. The method of claim 1 wherein said oxidizing is carried out under conditions effective in converting said Si nuclei into a roughened silicon oxide region.

14. The method of claim 1 wherein said oxidizing is carried out in an oxidizing ambient, at temperatures of from about 300° to about 1100° C., and for a time period of from about 1 second to about 4 hours.

15. The method of claim 14 wherein said oxidizing ambient is comprised of at least one of oxygen, ozone, or N$_2$O.

16. The method of claim 1 wherein after conducting step (i), but prior to conducting step (j), the electrode seed layer is cleaned.

17. The method of claim 1 wherein said exposed silicon nitride layer is removed by RIE.

18. The method of claim 1 wherein said noble metal is selected from the group consisting of Ru, Os, Pd, Pt, Ag, Au, and alloys thereof.

19. The method of claim 18 wherein said noble metal is Pt or a Pt-containing alloy.

20. The method of claim 1, further comprising depositing a dielectric material layer on said electrode, said dielectric material being a high-ε or ferroelectric material, and depositing a conductive material on said dielectric material layer.

* * * * *